United States Patent
Wu

Patent Number: 6,162,681
Date of Patent: *Dec. 19, 2000

[54] DRAM CELL WITH A FORK-SHAPED CAPACITOR

[75] Inventor: Shye-Lin Wu, Hsinchu, Taiwan

[73] Assignee: Texas Instruments - Acer Incorporated, Hsinchu, Taiwan

[*] Notice: This patent is subject to a terminal disclaimer.

[21] Appl. No.: 09/346,042

[22] Filed: Jul. 6, 1999

Related U.S. Application Data

[63] Continuation-in-part of application No. 09/013,690, Jan. 26, 1998, Pat. No. 5,905,281.

[51] Int. Cl.[7] .................. H01L 21/8242; H01L 21/20
[52] U.S. Cl. .................. 438/256; 438/239; 438/240; 438/241; 438/242; 438/250; 438/251; 438/253; 438/254; 438/255; 438/256; 438/393; 438/394; 438/396; 438/397; 438/398; 438/399
[58] Field of Search .................. 438/239, 240, 438/241, 242, 250, 251, 253, 254, 255, 256, 393, 394, 396, 397, 398, 399

[56] References Cited

U.S. PATENT DOCUMENTS

| | | | |
|---|---|---|---|
| 5,702,974 | 12/1997 | Kim | 437/60 |
| 5,972,769 | 10/1999 | Tsu et al. | 438/396 |
| 6,027,981 | 2/2000 | Wu | 438/396 |

*Primary Examiner*—Richard Booth
*Assistant Examiner*—Jennifer M. Kennedy
*Attorney, Agent, or Firm*—Harness, Dickey & Pierce, P.L.C.

[57] ABSTRACT

A method for forming a fork-shaped capacitor of a dynamic random access memory cell is disclosed. The method includes forming a first conductive layer (118) over a semiconductor substrate (110), wherein at least a portion of the first doped polysilicon layer communicates to the substrate. A first dielectric layer is formed on the first conductive layer and is then patterned to form an opening therein and expose a portion of the first conductive layer. A second conductive layer is formed on the sidewall of the first dielectric layer and the exposed portion of the first conductive layer. A second dielectric spacer is formed on the sidewall of the second conductive layer. The first conductive layer is etched using the second dielectric layer as a mask, and a third conductive spacer is formed on the sidewalls of the second dielectric spacer. The second dielectric layer are then removed. Finally, a third dielectric layer and a fourth conductive layer are formed in turn on the first, the second, and the third conductive layers.

12 Claims, 7 Drawing Sheets

DRAM CELL WITH A FORK-SHAPED CAPACITOR

CROSS REFERENCE TO RELATED APPLICATIONS

This invention is a continuation-in-part application of an application filed at Jan. 26, 1998 with a Ser. No. 09/013,690 now U.S. Pat. No. 5,905,281, under the same title and assigned to same assignee with a common inventor as the present application.

BACKGROUND OF THE INVENTION

1. Field of the Invention

The present invention relates to dynamic random access memory (DRAM) fabrication, and more particularly, to a dynamic random access memory cell with a fork-shaped capacitor.

2. Description of the Prior Art

Figure 1:
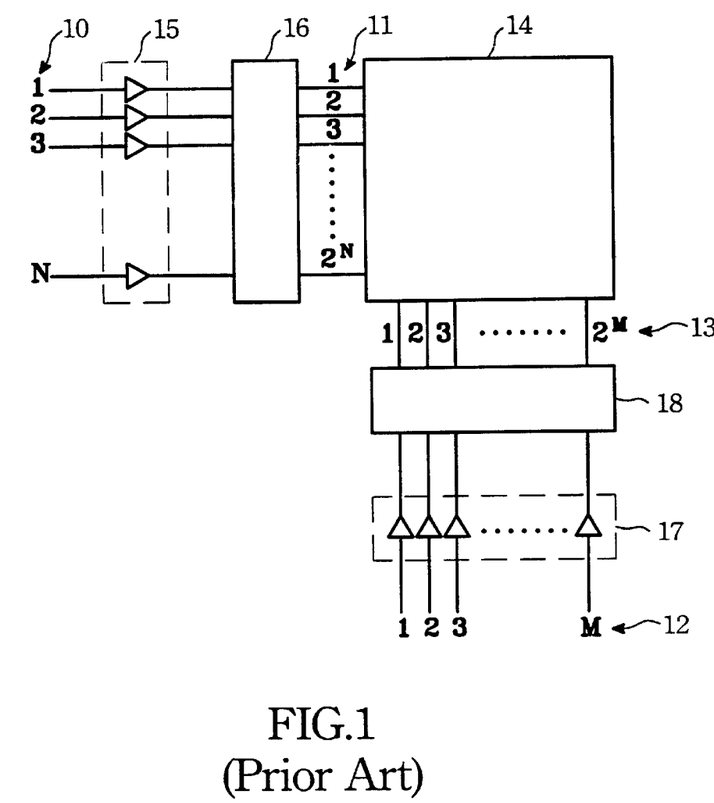
FIG. 1 shows a simplified diagram illustrative of the organization of a typical large semiconductor memory.

The increasing popularity of electronic equipment, such as computers, is increasing the demand for large semiconductor memories. FIG. 1 shows a simplified diagram of the organization of a typical large semiconductor memory 14. The storage cells of the memory 14 are arranged in an array including horizontal rows and vertical columns. The horizontal lines connected to all of the cells in the row are referred to as word lines 11, and the vertical lines connected to all of the cells in the column are referred to as bit lines 13. Data flow into and out of the cells via the bit lines 13.

Row address 10 and column address 12 are used to identify a location in the memory 14. A row address buffer 15 and a column address buffer 17, respectively, receive row address 10 signals and column address 12 signals. The buffers 15 and 17 then drive these signals to a row decoder 16 and column decoder 18, respectively. The row decoder 16 and the column decoder 18 then select the appropriate word line and bit line corresponding to the received address signal. The word and bit lines select a particular memory cell of the memory 14 corresponding to the received address signals. As is known in the art of semiconductor memory fabrication, the row decoder 16 and the column decoder 18 reduce the number of address lines needed for accessing a large number of storage cells in the memory 14.

The array configuration of semiconductor memory 14 lends itself well to the regular structure preferred in "very large scale integration" (VLSI) ICs. For example, the memory 14 can be a dynamic random access memory (DRAM). DRAMs have become one of the most widely used types of semiconductor memory due to its low cost per bit, high device density and flexibility of use concerning reading and writing operations.

Figure 2A:
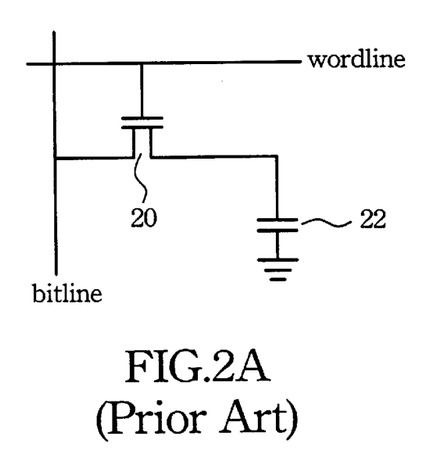
FIG. 2A shows a circuit schematic diagram of a typical one-transistor dynamic random access memory (DRAM) cell.
Figure 2B:
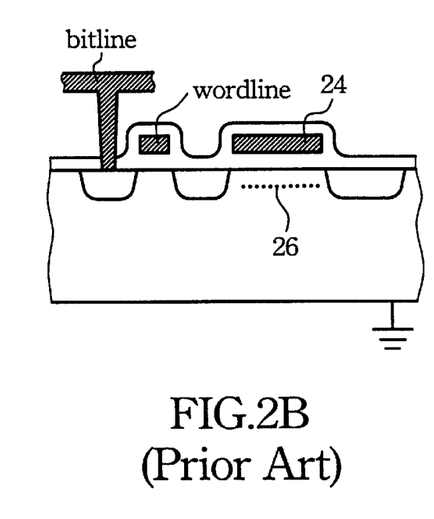
FIG. 2B shows a cross-sectional view illustrative of traditional one-transistor DRAM storage cell.

Early DRAMs used storage cells each consisting of three transistors and were manufactured using P type channel metal-oxide-semiconductor (PMOS) technology. Later, a DRAM storage cell structure consisting of one transistor and one capacitor was developed. A circuit schematic diagram corresponding to this structure is shown in FIG. 2A. The gate of the transistor 20 is controlled by a word line signal, and data, represented by the logic level of a capacitor voltage, is written into or read out of the capacitor 22 through a bit line. FIG. 2B shows the cross section of a traditional one-transistor DRAM storage cell that uses a polysilicon layer 24 as one plate of the capacitor. The substrate region under the polysilicon plate 24 serves as the other capacitor electrode. A voltage can be applied to the plate 24 to store a logic value into the capacitor.

As the semiconductor memory device becomes more highly integrated, the area occupied by a capacitor of a DRAM storage cell typically shrinks. Thus, the capacitance of the capacitor is reduced owing to its smaller electrode surface area. However, a relatively large capacitance is required to achieve a high signal-to-noise ration in reading the memory cell and to reduce soft errors (due to alpha particle interference). Therefore, it is desirable to reduce the cell dimension and yet obtain a high capacitance, thereby achieving both high cell integration and reliable operation.

One approach for increasing the capacitance while maintaining the high integration of the storage cells is directed toward the shape of the capacitor electrodes. In this approach, the polysilicon layer implementing the capacitor electrodes may have protrusions, fins, cavities, etc., to increase the surface area of the capacitor electrode, thereby increasing the capacitor's capacitance while maintaining the small area occupied on the substrate surface. Consequently, this type of capacitor has come to be widely used in DRAM devices.

SUMMARY OF THE INVENTION

In accordance with the present invention, a method is provided for forming a fork-shaped capacitor of a dynamic random access memory cell that substantially increases the surface of the capacitor. In one embodiment, a first dielectric layer is formed on a semiconductor substrate, and a silicon nitride layer is then formed on the first dielectric layer. Next, the first dielectric layer and the silicon nitride layer are patterned to form a contact hole in the first dielectric layer and the silicon nitride layer, therefore exposing a portion of the substrate. A first conductive layer is then formed on the silicon nitride layer to refill the contact hole. Thereafter, a second dielectric layer is formed on the first conductive layer, and is then patterned to form an opening in the silicon oxide layer and expose a portion of the first conductive layer. A second conductive layer is formed on the exposed portion of the first conductive layer and the second dielectric layer, including the sidewalls of the opening. An oxide layer is form on the second conductive layer and fills the opening. After etching back the portions of the oxide layer and the second conductive layer that exceeds the opening, the second dielectric layer is removed and a third dielectric spacer is formed on the sidewall of the second conductive layer. The first conductive layer is etched using the third dielectric layer as a mask, and a third conductive spacer is formed on the sidewalls of the third dielectric spacer. The third dielectric spacer is then removed. Finally, a fourth dielectric layer is formed on the first conductive layer, the second conductive layer, and the third conductive layer, and a fourth conductive layer is formed on the fourth dielectric layer.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DESCRIPTION OF THE PREFERRED EMBODIMENT

Figure 3:
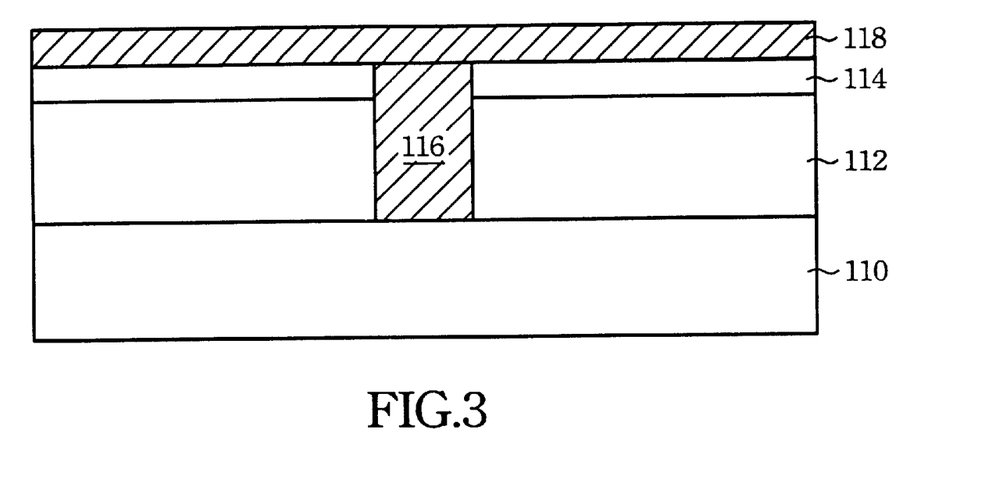
FIGS. 3–14 show cross-sectional views illustrative of various stages in the fabrication of a DRAM capacitor in accordance with the present invention.

FIG. 3 shows a cross-sectional view illustrative of a portion of a dynamic random access memory (DRAM) cell in accordance with one embodiment of the present invention, wherein a dielectric layer 112, such as tetraethylorthosilicate (TEOS) or boro-phospliosilicate glass (BPSG), is deposited on a semiconductor substrate 110. A silicon nitride layer 114 is then deposited on the dielectric layer 112. In this embodiment, this silicon nitride layer 114 is deposited using a conventional low pressure chemical vapor deposition (LPCVD) or plasma enhanced chemical vapor deposition (PECVD) process. The thickness of this silicon nitride layer 114 can range from about 1000 to 10000 angstroms. It is noted that a contact hole 116 is also formed in the silicon oxide layer 114 and the dielectric layer 112 so that a portion of the substrate 110, such as a source region, is exposed.

A first conductive layer 118 is then formed on the silicon nitride layer 114, therefore filling the contact hole 116. Conductive materials like polysilicon, metals, or metal compounds can be used. In this embodiment, the first conductive layer 118 is preferably selected from metals or metal compound materials. In the case, metals like titanium (Ti), tungsten (W), tantalum (Ta), Nickel (Ni), Palladium (Pd), Platinum (Pt), Cobalt (Co), Molybdenum (Mo), Strontium (Sr), Yttrium (Y), Ruthenium (Ru), Lead (Pb) or metal compounds like metal nitride, metal silicide, and metal oxide of above mentioned metals can be used to serve as a portion of the conductive electrode of the capacitor structure. Some commonly employed materials in present semiconductor manufacturing process include titanium nitride, tungsten nitride, tantalum nitride, and tungsten silicide. The metal or metal compound can be deposited with a chemical vapor deposition (CVD) process. A sputtering process can be used alternatively to deposit the metals or metal compound. By employing a metal or metal compound material as a portion of the capacitor electrode, the conductivity of the plate and the operational characteristics of the capacitor can be greatly increased. The first conductive layer 118 can be deposited with a thickness of about 1000–6000 angstroms above the surface of the silicon nitride layer 114. Furthermore, in order to improve the physical and electrical characteristics between different materials, a barrier layer like titanium nitride can be employed between the deposited metal or metal compound and the silicon substrate 110. The conductivity of the interface connection can be increased with the barrier layer.

Figure 4:
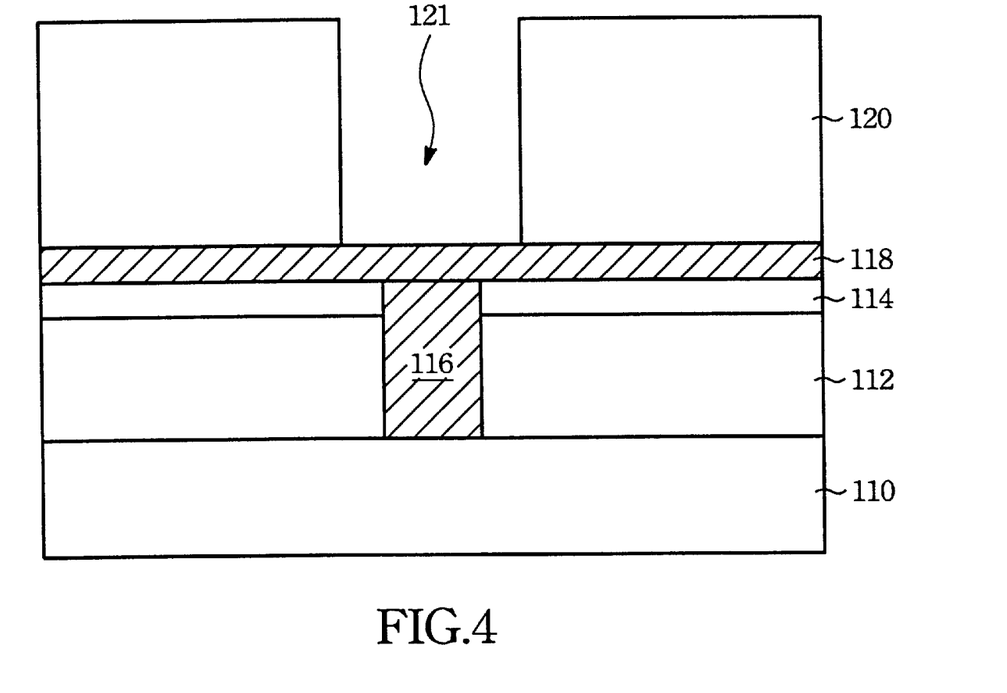

Referring to FIG. 4, dielectric layer 120, such as silicon oxide layer, is then deposited on the first conductive layer 118 with a thickness of about 3000–10000 angstroms. In this embodiment, the silicon oxide layer 120 is deposited using a conventional low pressure chemical vapor deposition (LPCVD) or plasma enhanced chemical vapor deposition (PECVD). A material of tetra-ethyl-ortho-silicate-oxide (TEOS-oxide), ozone TEOS-oxide, boro-phospho silicate glass (BPSG), phospho silicate glass (PSG), boro silicate glass, (BSG), undoped silicate glass (USG) or silicon-rich oxide (SRO), and so on, can be employed for this oxide deposition.

A conventional manner of photolithography including photoresist coating, exposure, and development processes is then carried out to pattern a photoresist on the silicon oxide 120. A anisotropic etching follows to define a storage node region and form an opening 121 in the silicon oxide layer 120 and expose a portion of the first conductive layer 118.

In a preferred embodiment, a dry etching with plasma gases containing fluoride such as $CF_4$, $CHF_3$, $C_2F_6$ or $C_3F_8$ can be adopted for the anisotropic oxide etching.

Figure 5:
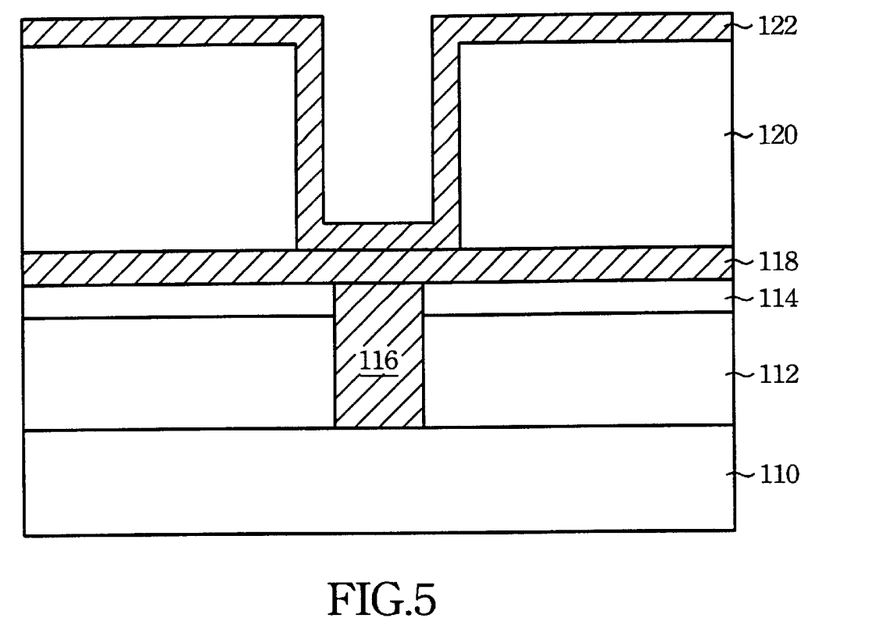

After the photoresist is removed and wet cleaned, a second conductive layer 122 is deposited on the silicon oxide layer 120 and the first conductive layer 118, including the sidewalls of the opening 121, as shown in FIG. 5. Conductive materials like doped polysilicon, metals, or metal compounds can be used. In this embodiment, the second conductive layer 122 is preferably selected from metals or metal compound materials. In the case, metals like titanium (Ti), tungsten (W), tantalum (Ta), Nickel (Ni), Palladium (Pd), Platinum (Pt), Cobalt (Co), Molybdenum (Mo), Strontium (Sr), Yttrium (Y), Ruthenium (Ru), Lead (Pb) or metal compounds like metal nitride, metal silicide, and metal oxide can be used to serve as a portion of the conductive electrode of the capacitor structure. Some commonly employed materials in present semiconductor manufacturing process include titanium nitride, tungsten nitride, tantalum nitride, and tungsten silicide. The metal or metal compound can be deposited with a chemical vapor deposition (CVD) process. A sputtering process can be used alternatively to deposit the metal or metal compound. The thickness of the second conductive layer 122 can be about 300–3000 angstroms in the embodiments. By employing metal or metal compound material as a portion of the capacitor electrode, the conductivity of the plate and the operational characteristics of the capacitor can be greatly increased. A barrier layer can also be employed if an interface between silicon and metals or metal compounds is presented.

Figure 6:
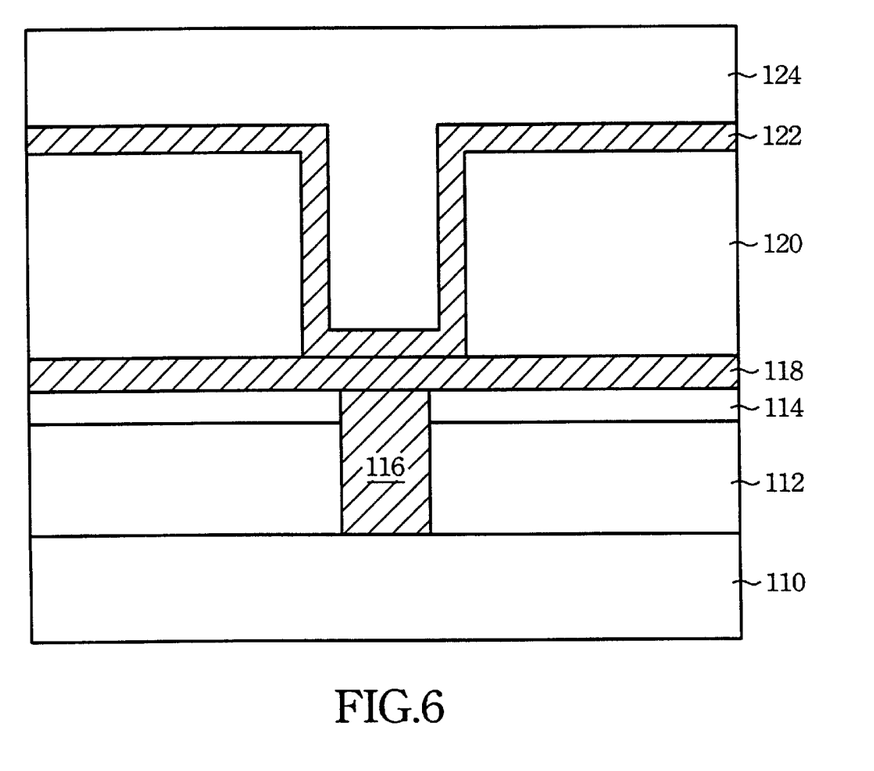

Next, referring to FIG. 6, a dielectric layer 124, such as silicon oxide layer, is formed on the second conductive layer 122 and fills the opening 121. In this embodiment, the silicon oxide layer 124 is deposited using a conventional low pressure chemical vapor deposition (LPCVD) or plasma enhanced chemical vapor deposition (PECVD). A material of tetra-ethyl-ortho-silicate-oxide (TEOS-oxide), ozone TEOS-oxide, boro-phospho silicate glass (BPSG), phospho silicate glass (PSG), boro silicate glass, (BSG), undoped silicate glass (USG) or silicon-rich oxide (SRO), and so on, can be employed for this oxide deposition.

Figure 7:
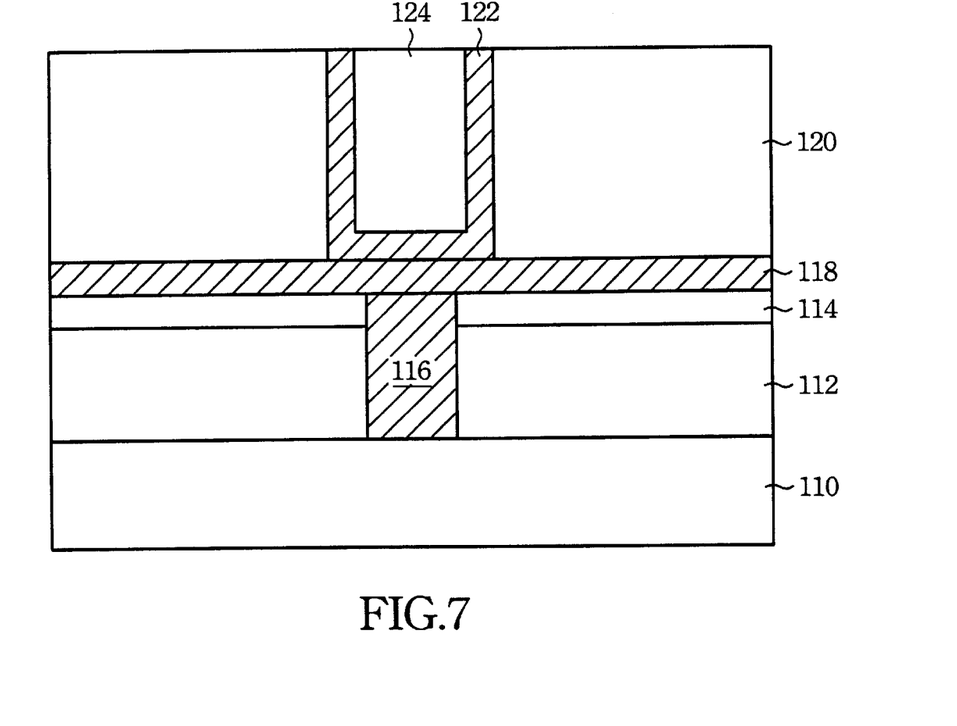
Figure 8:
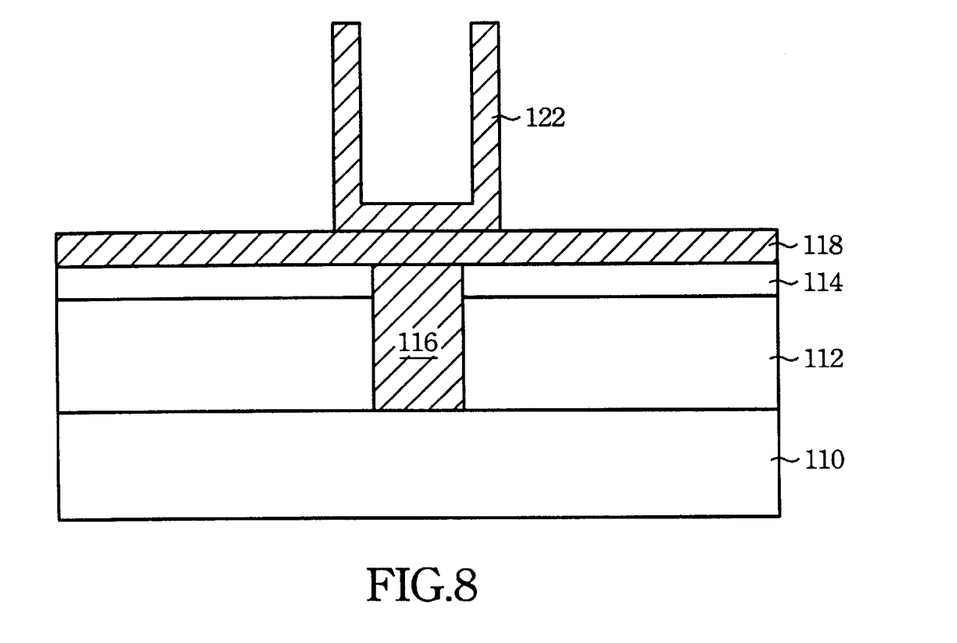

Thereafter, the CVD oxide layer 124 and the second conductive layer 122 are etched back. A chemical mechanical polishing (CMP) process can be adopted for this etching back step. The portions of these two layers 122 and 124 that exceed the silicon oxide layer 120 are stripped as shown in FIG. 7. The silicon oxide layer 120 is subsequently removed by using, for example, a wet etching with buffered oxide-etching (BOE) solution or diluted solution of hydrofluoric acid (HF) as the etchant. The resultant cross-sectional view of the wafer after this step is shown in FIG. 8.

Figure 9:
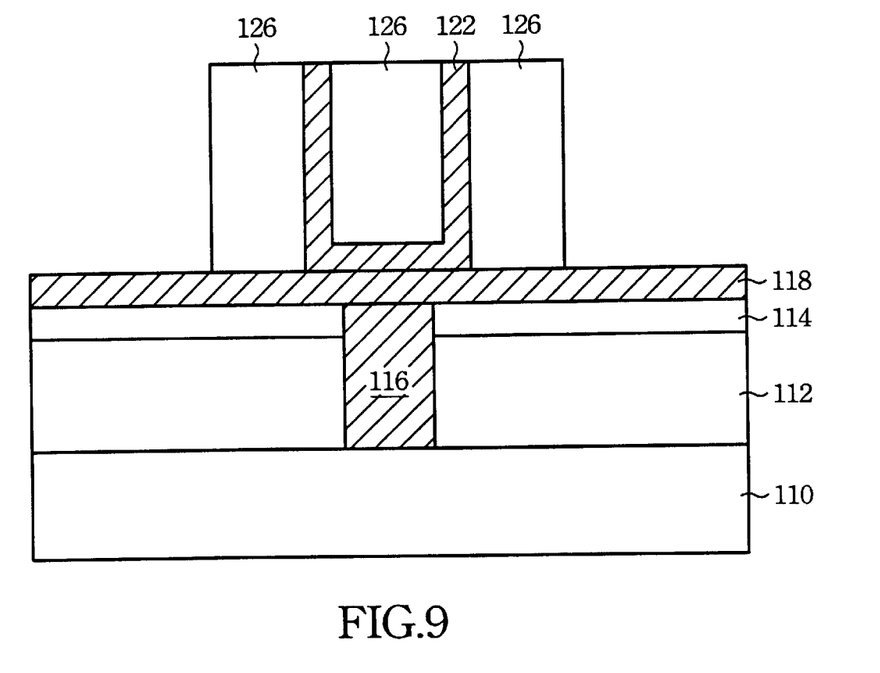

Next, referring to FIG. 9, a dielectric spacer 126, such as silicon oxide spacer, is formed on the sidewall of the second conductive layer 122. This silicon oxide spacer 126 is preferably formed by firstly blanket depositing a silicon oxide layer 126 over the first and second conductive layers 118 and 122, followed by an etching back process to form the silicon oxide spacer 126. In this embodiment, the silicon oxide layer 124 is deposited using a conventional low pressure chemical vapor deposition (LPCVD) or plasma enhanced chemical vapor deposition (PECVD). A material of tetra-ethyl-ortho-silicate-oxide (TEOS-oxide), ozone TEOS-oxide, boro-phospho silicate glass (BPSG), phospho silicate glass (PSG), boro silicate glass, (BSG), undoped silicate glass (USG) or silicon-rich oxide (SRO), and so on, can be employed for this oxide deposition.

Figure 10:
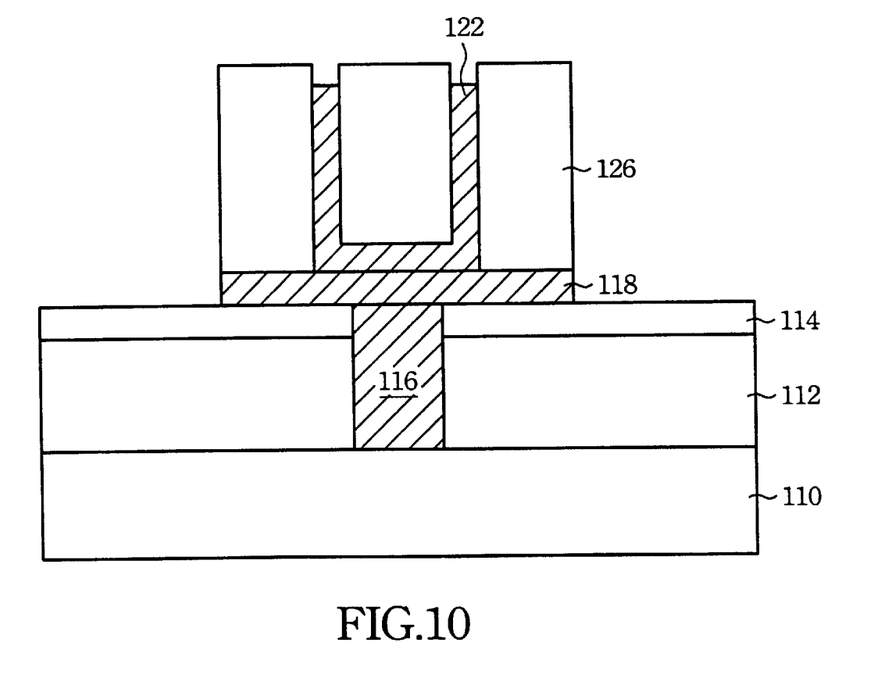

Referring to FIG. 10, the first conductive layer 118 are etched back using the silicon oxide layer 126 as a mask until the surfaces of the silicon nitride layer 114 is exposed. At this etching step, the second conductive layer 122 would also be etched for a certain thickness if the similar material to the first conductive layer 118 were employed. The etching of the second conductive layer 122 and the first conductive layer 118 is preferably done, for example, by a plasma etching process in this embodiment.

Figure 11:
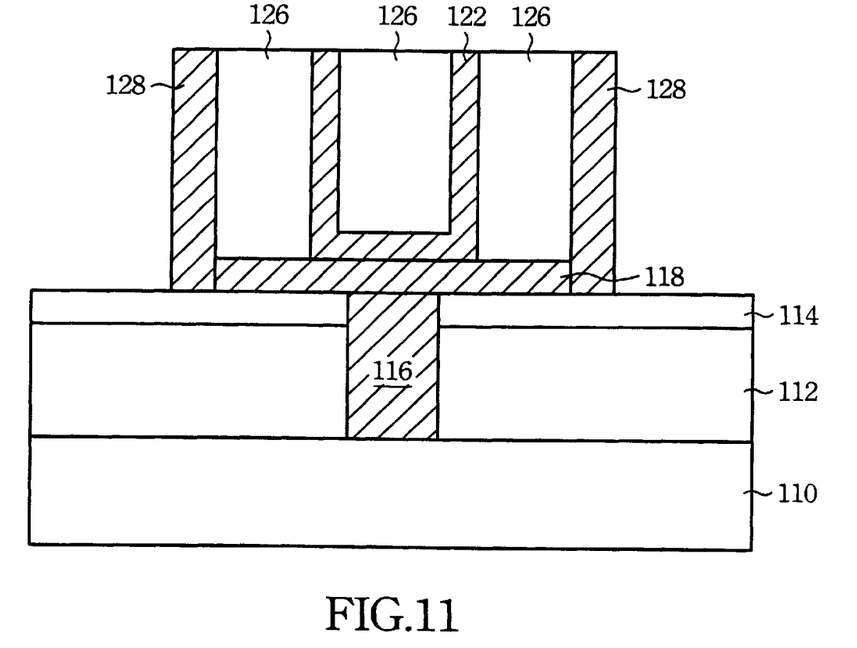

Third conductive spacers 128 are formed on the sidewalls of the silicon oxide spacer 126 and the first conductive layer 118 as shown in FIG. 11. Conductive materials like polysilicon, metals, or metal compounds can be used. In this embodiment, the third conductive spacers 128 are preferably selected from metal or metal compound materials. In the case, metals like titanium (Ti), tungsten (W), tantalum (Ta), Nickel (Ni), Palladium (Pd), Platinum (Pt), Cobalt (Co), Molybdenum (Mo), Strontium (Sr), Yttrium (Y), Ruthenium (Ru), Lead (Pb) or metal compounds like metal nitride, metal silicide, and metal oxide can be used to serve as a portion of the conductive electrode of the capacitor structure. Some commonly employed materials in present semiconductor manufacturing process include titanium nitride, tungsten nitride, tantalum nitride, and tungsten silicide. As mentioned above, the metal or metal compound can be deposited with a chemical vapor deposition (CVD) process. A sputtering process can be used alternatively to deposit the metal or metal compound. The thickness of the second conductive layer 122 can be about 300–3000 angstroms in the embodiments. This third conductive spacers 126 are preferably formed by firstly blanket depositing a conformal layer over the structure of FIG. 10, followed by etching back to form the third conductive spacers 126.

Figure 12:
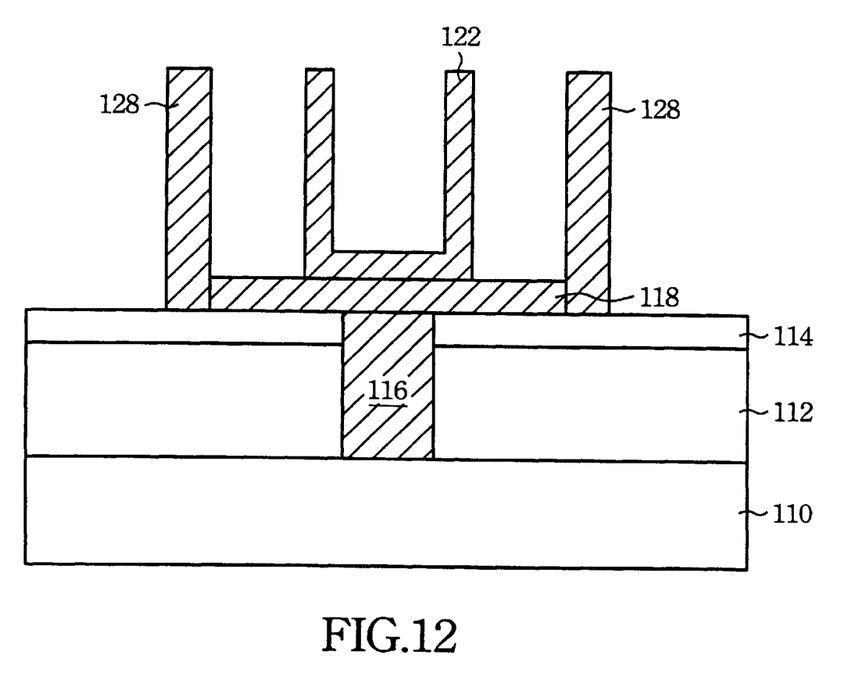

After removing the silicon oxide layer 124 and the silicon oxide layer 126, for example, by buffered oxide-etching (BOE) solution or diluted solution of hydrofluoric acid (HF), a fork-shaped bottom electrode of the DRAM cell, including conductive layers 118, 122 and 128, is thus formed as shown in FIG. 12.

Figure 13:
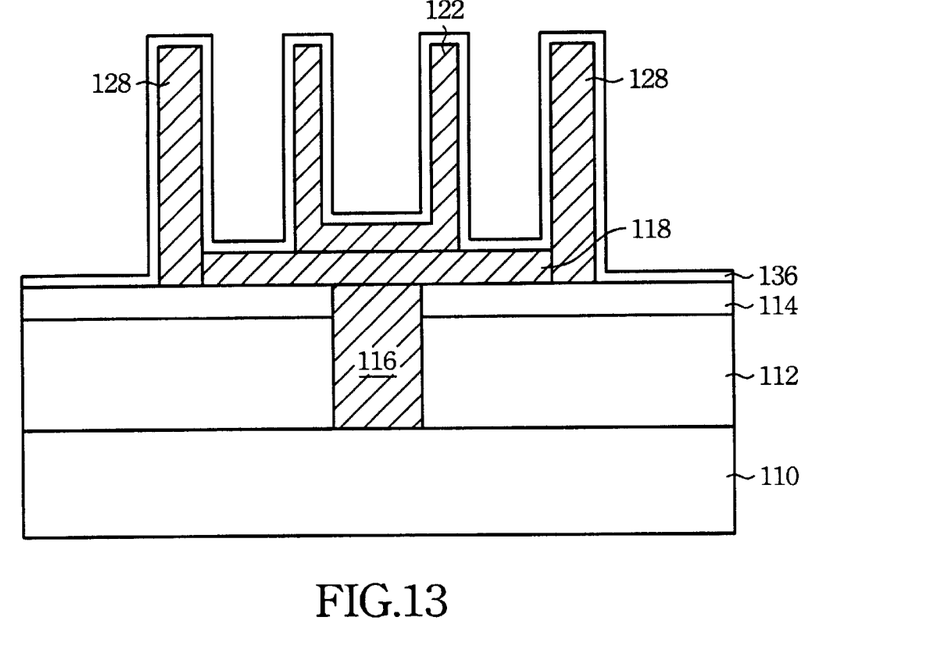

Referring to FIG. 13, a dielectric film 136 is then formed in the conventional manner. In this embodiment, a thin dielectric layer 136, such as stacked oxide-nitride-oxide (ONO) film, is formed on the exposed surface of the bottom electrode (i.e., the storage node including conductive regions 118, 122, and 128) and the surface of the silicon nitride layer 114. As is known in the art of DRAM fabrication, the ONO film is reliable over shaped silicon surfaces, and is typically used as a capacitor insulator. The bottom oxide layer of the stacked oxide-nitride-oxide (ONO) film 136 is conventionally formed by thermally oxidizing the silicon surface, depositing an LPCVD silicon nitride layer and then oxidizing the silicon nitride layer to form the top oxide layer. Other materials such as nitride-oxide (NO) film, $Ta_2O_5$, $TiO_2$, PZT, BST, PLZT, PST, $Al_2O_3$, and $Y_2O_3$ can be used as the thin dielectric layer 136.

Figure 14:
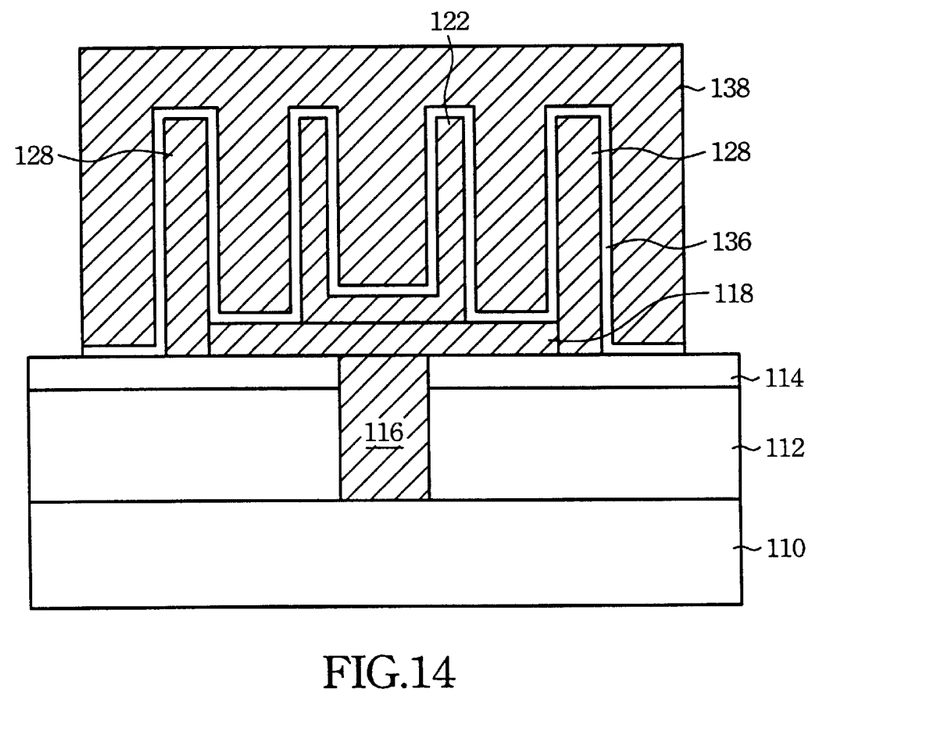

Finally, referring to FIG. 14, a conductive layer 138 is then deposited over the stack oxide/silicon nitride/oxide layer 136 to serve as a top electrode of the DRAM cell capacitor. Typically, the conductive layer 138 can be a layer of polysilicon, metals, metal compound, or metal silicide as described above.

Although specific embodiments have been illustrated and described, it will be obvious to those skilled in the art that various modifications may be made without departing from the spirit which is intended to be limited solely by the appended claims.

What is claimed is:

1. A method for forming a capacitor of a dynamic random access memory cell, said method comprising:

forming a first conductive layer over a semiconductor substrate, at least a portion of said first conductive layer communicating to said semiconductor substrate;

forming a first dielectric layer on said first conductive layer;

patterning said first dielectric layer to form an opening in said first dielectric layer, thereby exposing a portion of said first conductive layer;

forming a second conductive layer blanketing over said exposed portion of said first conductive layer, the surface of said first dielectric layer, and the sidewall of said opening in said first dielectric layer;

forming a second dielectric layer for filling in said opening and blanketing over the surface of said second conductive layer;

etching a portion of said second dielectric layer that exceeds said second conductive layer;

etching a portion of said second conductive layer that exceeds said opening in said first dielectric layer, thereby uncovering the surface of said first dielectric layer;

removing said first dielectric layer;

removing said second dielectric layer;

forming a third dielectric spacer on the sidewall of said second conductive layer;

etching said first conductive layer by using said third dielectric spacer as a mask;

forming a third conductive spacer on the sidewall of said third dielectric spacer;

removing said third dielectric spacer;

forming a fourth dielectric layer on said first conductive layer, said second conductive layer, and said third conductive spacer; and forming a fourth conductive layer on said fourth dielectric layer.

2. The method according to claim 1, wherein said first, second, fourth conductive layer, and third conductive spacer comprise an element chosen from the group consisting of doped polysilicon, metals, metal compounds and silicide.

3. The method according to claim 1, wherein said first dielectric layer is a silicon oxide layer formed of a material selected from the group consisting of tetra-ethyl-ortho-silicate-oxide (TEOS-oxide), boro-phospho silicate glass (BPSG), phospho silicate glass (PSG), boro silicate glass, (BSG), and undoped silicate glass (USG).

4. The method according to claim 3, wherein said first dielectric layer is removed by a wet etching process using an etchant selected from the group consisting of buffered oxide-etching (BOE) solution and diluted solution of hydrofluoric acid (HF).

5. The method according to claim 1, wherein said third dielectric spacer is formed by the following steps:

performing a blanket deposition to deposit a dielectric spacer layer on said first conductive layer; and etching back said dielectric spacer layer to form said third dielectric spacer.

6. The method according to claim 1, wherein said third dielectric spacer is a silicon oxide layer formed of a material selected from the group consisting of tetra-ethyl-ortho-silicate-oxide (TEOS-oxide), boro-phospho silicate glass (BPSG), phospho silicate glass (PSG), boro silicate glass, (BSG), and undoped silicate glass (USG).

7. The method according to claim 1, wherein said fourth dielectric layer comprises an element chosen from the group consisting of oxide-nitride-oxide (ONO) film, nitride-oxide (NO) film, $Ta_2O_5$, $TiO_2$, PZT, BST, PLZT, PST, $Al_2O_3$, and $Y_2O_3$.

8. A method for forming a capacitor of a dynamic random access memory cell, said method comprising:

forming a base dielectric layer on a semiconductor substrate;

forming a silicon nitride layer on said base dielectric layer;

patterning said base dielectric layer and said silicon nitride layer to form a contact hole in said base dielectric layer and said silicon nitride layer, thereby exposing a portion of said semiconductor substrate;

forming a first conductive layer on said silicon nitride layer, thereby refilling said contact hole;

forming a first dielectric layer on said first conductive layer;

patterning said first dielectric layer for exposing a portion of said first conductive layer;

forming a second conductive layer on said first dielectric layer and said exposed portion of said first conductive layer;

forming a sacrificial dielectric layer on said second conductive layer;

removing portions of said second conductive layer and said sacrificial dielectric layer that exceed said first dielectric layer;

removing said first dielectric layer;

removing said sacrificial dielectric layer;

forming a second dielectric spacer on the sidewall of said second conductive layer;

etching said first conductive layer by using said second dielectric spacer as a mask;

forming a third conductive spacer on the sidewall of said second dielectric spacer;

removing said second dielectric spacer;

forming a third dielectric layer on said first conductive layer, said second conductive layer, and said third conductive spacer; and forming a fourth conductive layer on said third dielectric layer.

9. The method according to claim 8, wherein said first, second, fourth conductive layer and third conductive spacer comprise an element chosen from the group consisting of doped polysilicon, metals, metal compounds and silicide.

10. The method according to claim 8, wherein said base, first, and second dielectric layer comprise an element selected from the group consisting of tetra-ethyl-ortho-silicate-oxide (TEOS-oxide), boro-phospho silicate glass (BPSG), phospho silicate glass (PSG), boro silicate glass, (BSG), and undoped silicate glass (USG).

11. The method according to claim 10, wherein said first dielectric layer is removed by a wet etching process using an etchant selected from the group consisting of buffered oxide-etching (BOE) solution and diluted solution of hydrofluoric acid (HF).

12. The capacitor according to claim 8, wherein said third dielectric layer comprises an element chosen from the group consisting of oxide-nitride-oxide (ONO), NO, $Ta_2O_5$, $TiO_2$, PZT, BST, PLZT, PST, $Al_2O_3$, and $Y_2O_3$.

* * * * *